(12) United States Patent
Zeidler et al.

(10) Patent No.: US 11,158,482 B2
(45) Date of Patent: Oct. 26, 2021

(54) MULTI-BEAM PARTICLE MICROSCOPE

(71) Applicant: Carl Zeiss MultiSEM GmbH, Oberkochen (DE)

(72) Inventors: Dirk Zeidler, Oberkochen (DE); Stefan Schubert, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 16/993,392

(22) Filed: Aug. 14, 2020

(65) Prior Publication Data

US 2020/0373116 A1 Nov. 26, 2020

Related U.S. Application Data

(63) Continuation of application No. PCT/EP2019/053526, filed on Feb. 13, 2019.

(30) Foreign Application Priority Data

Feb. 16, 2018 (DE) .......................... 102018202428.6

(51) Int. Cl.
*H01J 37/09* (2006.01)
*H01J 37/05* (2006.01)
(Continued)

(52) U.S. Cl.
CPC .............. *H01J 37/09* (2013.01); *H01J 37/05* (2013.01); *H01J 37/10* (2013.01); *H01J 37/244* (2013.01);
(Continued)

(58) Field of Classification Search
CPC .. H01J 37/09; H01J 37/05; H01J 37/10; H01J 37/244; H01J 37/28; H01J 2237/0453;
(Continued)

(56) References Cited

U.S. PATENT DOCUMENTS 4,130,761 A 12/1978 Matsuda
4,153,843 A 5/1979 Pease
(Continued)

FOREIGN PATENT DOCUMENTS

DE 10 2013 016 113 A1 3/2015
DE 10 2016 120 902 A1 5/2018
(Continued)

OTHER PUBLICATIONS

H. Rose et al., "Aberration Correction in Electron Microscopy", Proceedings of 2005 Particle Accelerator Conference, Knoxville, Tennessee, 2005, pp. 44-48.
(Continued)

*Primary Examiner* — David A Vanore
(74) *Attorney, Agent, or Firm* — Fish & Richardson P.C.

(57) ABSTRACT

A multi-beam particle microscope includes a multi-beam particle source, an objective lens, a detector arrangement, and a multi-aperture plate with a multiplicity of openings. The multi-aperture plate is between the objective lens and the object plane. The multi-aperture plate includes a multiplicity of converters which convert backscattered electrons which are generated by primary particle beams at an object into electrons with a lower energy, which provide electrons that form electron beams detected by the detector arrangement.

22 Claims, 4 Drawing Sheets

(51) Int. Cl.
*H01J 37/10* (2006.01)
*H01J 37/244* (2006.01)
*H01J 37/28* (2006.01)

(52) U.S. Cl.
CPC ....... *H01J 37/28* (2013.01); *H01J 2237/0453* (2013.01); *H01J 2237/0492* (2013.01); *H01J 2237/057* (2013.01); *H01J 2237/24475* (2013.01)

(58) Field of Classification Search
CPC ......... H01J 2237/0492; H01J 2237/057; H01J 2237/24475; H01J 2237/2446; H01J 2237/2482; H01J 37/04
See application file for complete search history.

(56) References Cited

U.S. PATENT DOCUMENTS

| | | | |
|---|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,465,783 B1 | 10/2002 | Nakasuji |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,946,655 B2 | 9/2005 | Almogy et al. |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,842 B2 | 6/2014 | Ohashi |
| 8,779,399 B2 | 7/2014 | Yamanaka |
| 8,829,465 B2 | 9/2014 | Tsunoda |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 * | 12/2020 | Sarov .................. H01J 37/3177 |
| 10,879,031 B2 | 12/2020 | Ren |
| 10,896,800 B2 | 1/2021 | Riedesel |
| 2006/0289804 A1 | 12/2006 | Knippelmeyer et al. |
| 2009/0014649 A1 | 1/2009 | Nakasuji |
| 2009/0114818 A1 | 5/2009 | Casares et al. |
| 2009/0159810 A1 | 6/2009 | Knippelmeyer et al. |
| 2009/0256075 A1 * | 10/2009 | Kemen ................. H01J 37/147 250/307 |
| 2010/0320382 A1 * | 12/2010 | Almogy ................ H01J 37/147 250/307 |
| 2012/0199740 A1 | 8/2012 | Zeidler et al. |
| 2013/0032713 A1 * | 2/2013 | Barbi .................... G01T 1/2018 250/307 |
| 2013/0187046 A1 * | 7/2013 | Zeidler .................. H01J 37/21 250/310 |
| 2014/0197325 A1 | 7/2014 | Kato |
| 2014/0224985 A1 * | 8/2014 | Rodgers ................ H01J 37/22 250/307 |
| 2014/0361167 A1 | 12/2014 | Morishita et al. |
| 2015/0069235 A1 * | 3/2015 | Kemen .................. H01J 37/10 250/311 |
| 2015/0083911 A1 * | 3/2015 | Zeidler ................. H01J 37/285 250/310 |
| 2015/0090879 A1 * | 4/2015 | Zeidler .................. H01J 37/28 250/307 |
| 2015/0348738 A1 * | 12/2015 | Zeidler .................. H01J 37/28 250/396 R |
| 2015/0357157 A1 * | 12/2015 | Mueller ................. H01J 37/28 250/396 R |
| 2016/0064180 A1 | 3/2016 | Ren et al. |
| 2016/0284505 A1 | 9/2016 | Ren et al. |
| 2017/0117114 A1 * | 4/2017 | Zeidler ................. H01J 37/28 |
| 2017/0133198 A1 | 5/2017 | Kruit |
| 2017/0154756 A1 | 6/2017 | Ren et al. |
| 2017/0316912 A1 * | 11/2017 | Zeidler ................. H01J 37/05 |
| 2018/0217059 A1 * | 8/2018 | Barbi .................... H01J 37/28 |
| 2019/0333732 A1 * | 10/2019 | Ren ..................... H01J 37/3177 |
| 2019/0355544 A1 * | 11/2019 | Riedesel ............... H01J 37/244 |
| 2020/0211810 A1 * | 7/2020 | Zeidler ................. H01J 37/243 |
| 2020/0243300 A1 * | 7/2020 | Zeidler ................. H01J 37/263 |
| 2020/0373116 A1 * | 11/2020 | Zeidler ................. H01J 37/09 |
| 2021/0005423 A1 * | 1/2021 | Zeidler ................. H01J 37/3177 |
| 2021/0035773 A1 * | 2/2021 | Zeidler ................. H01J 37/147 |

FOREIGN PATENT DOCUMENTS

| | | | |
|---|---|---|---|
| GB | 2519511 A | 4/2015 |
| GB | 2521819 A | 7/2015 |
| JP | 59184524 A | 10/1984 |

(56) References Cited

FOREIGN PATENT DOCUMENTS

| | | |
|---|---|---|
| JP | 60042825 A | 3/1985 |
| JP | 60105229 A | 6/1985 |
| JP | 61263217 A | 11/1986 |
| JP | 2005-005178 A | 1/2005 |
| JP | 2007-059111 A | 3/2007 |
| JP | 2014229481 A | 12/2014 |
| WO | WO2013032949 A1 | 3/2013 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

OTHER PUBLICATIONS

German Office Action, with translation thereof, for corresponding DE application No. 10 2018 202 428.6 dated Aug. 21, 2018.
International search report (translation will follow) for corresponding international application No. PCT/EP2019/053526 dated Jun. 28, 2019.
Translation of International Preliminary Report on Patentability for corresponding PCT Appl No. PCT/EP2019/053526, dated Aug. 18, 2020.

* cited by examiner

MULTI-BEAM PARTICLE MICROSCOPE

CROSS-REFERENCE TO RELATED APPLICATION

This application is a continuation of, and claims priority under 35 U.S.C. § 120 to, international patent application PCT/EP2019/053526, filed Feb. 13, 2019, which claims benefit under 35 U.S.C. § 119 of German patent application 10 2018 202 428.6, filed Feb. 16, 2018. The entire contents of these applications are incorporated by reference herein.

FIELD

The disclosure relates to a multi-beam particle microscope.

BACKGROUND

By way of example, WO 2012/041464 A1 and DE 10 2016 120 902 A1 have disclosed multi-beam particle microscopes in which a multiplicity of primary particle beams of a bundle of primary particle beams are focussed on an object. At the locations of their impact on the object, the primary particle beams generate secondary electrons which are accelerated away from the object by an electric field applied to the object and which are shaped into secondary particle beams, the latter being directed to a detector arrangement with a multiplicity of detectors. Here, each individual primary particle beam generates a secondary particle beam assigned to the primary particle beam at the location of its impingement on the object and the secondary particle beam strikes at least one detector of the detector arrangement assigned thereto such that information about the location of the object on which the primary particle beam is directed can be obtained by detecting the particle intensity striking this at least one detector. The bundle of primary particle beams can be deflected by the multi-beam particle microscope and the object can be displaced relative to the multi-beam particle microscope in order to systematically scan the surface of the object with the primary particle beams and in order to obtain an electron-microscopic image of the object from the intensities of secondary particle beams detected in the process.

SUMMARY

It was found that such a multi-beam particle microscope does not allow certain structures on objects to be made visible in the electron-microscopic image as clearly and with as much contrast as in the case where single-beam particle microscopes are used.

The present disclosure proposes a multi-beam particle microscope which has extended options for making structures on objects visible in clear and high-contrast fashion in the electron-microscopic image.

According to an aspect of the disclosure, a multi-beam particle microscope includes: a multi-beam particle source which is configured to generate a multiplicity of primary particle beams; an objective lens which is penetrated by beam paths of the multiplicity of primary particle beams and configured to direct each of the multiplicity of primary particle beams onto, and focus each of the multiplicity of primary particle beams on, an object plane; and a detector arrangement which is configured to detect intensities of a multiplicity of electron beams. Electrons of the electron beams are generated by particles of the primary particle beams at an object which is arrangeable in the object plane.

During the operation of the multi-beam particle microscope, each of the primary particle beams can pass through an aperture of a multi-aperture plate and strikes the object in focus. At the location of incidence on the object, the primary particle beam can generate secondary electrons which emerge from the object and which are accelerated towards the multi-aperture plate. These secondary electrons can pass through the aperture of the multi-aperture plate in a direction away from the object and form an electron beam, which can pass through the objective lens and which is guided to the detector arrangement.

Upon their emergence from the surface of the object, the secondary electrons generated by the primary particle beam can typically have amounts of kinetic energy which are independent of the kinetic energy of the impinging primary particles and which are typically less than 50 eV. However, the primary particle beam usually also generates so-called backscattered electrons, which can emerge from the object at the location of incidence of the primary particle beam and which can have amounts of kinetic energy that are higher than 50 eV and that can reach up to the kinetic energy of the primary particles. The inventors have realized that these electrons, which have greater amounts of energy in comparison with the secondary electrons, are only guided to, and generate detection signals at, the detector arrangement to a very small extent. However, in the case of single-beam particle microscopes, it is possible to detect backscattered electrons separately and to generate electron-microscopic images from detection signals of backscattered electrons, which represent different materials in an object in a manner distinguishable from one another with a high contrast. The inventors have observed that it would be desirable to have the option of efficiently detecting backscattered electrons even in the case of the multi-beam particle microscope. The inventors have further realized that the electron beams which emanate from the object and which are guided to the detector arrangement are substantially formed from secondary electrons since these can be bundled into the individual electron beams on account of their low energy upon emergence from the surface of the object, while the backscattered electrons with substantially higher energies cannot be shaped into individual electron beams that, proceeding from the location of incidence of the primary particle beam onto the object, can be guided to an element of the detector arrangement assigned to this location.

Therefore, according to exemplary embodiments, the multi-aperture plate of the multi-beam particle microscope includes a multiplicity of converters. At least one converter of the multiplicity of converters is provided at each opening of the multiplicity of openings. The converters are configured to convert backscattered electrons which are generated by the primary particle beams at the object and which have amounts of kinetic energy at the object that are greater than a predetermined first energy threshold into electrons which have amounts of kinetic energy at the converter that are less than a predetermined second energy threshold and which provide electrons that form the electron beams that are detected by the detector arrangement.

Hence, the backscattered electrons with their comparatively high kinetic energy near the object and near the location from where they emerge from the surface of the object may be converted into electrons with a substantially lower kinetic energy. These electrons of lower kinetic energy arise in the vicinity of the impingement locations of the primary particle beams on the object. The electrons of lower kinetic energy arising there can then likewise be shaped into electron beams—like the secondary electrons generated at the location of impingement of the primary particle beam—and can be supplied to the detector arrangement for detection purposes. There, these converted low-energy electrons generate detection signals that are proportional to the number of backscattered electrons generated at the location of impingement of the primary particle beam. Consequently, the provision of the converters at the multi-aperture plate allows backscattered electrons to likewise be detected using the multi-beam particle microscope.

According to exemplary embodiments, the converters each include a thin membrane which is oriented substantially parallel to the object plane. The thin membranes can define or delimit the apertures in the multi-aperture plate. The backscattered electrons generated on the object can be incident on the surface of the membrane facing the object plane and can be converted into the lower energy electrons by the membrane, which lower energy electrons, at least in part, emerge from the surface of the membrane facing away from the object plane and are able to contribute to the electron beam that passes through the objective lens and that is supplied to the detector arrangement.

According to exemplary embodiments, the thickness of the membranes lies in a range from 0.5 nm to 50 nm, such as from 4 nm to 20 nm.

By way of example, a high conversion rate of backscattered electrons into the lower energy electrons can be achieved if the membranes are made of a material made of heavy elements. According to exemplary embodiments, the membranes are made of a material which has atoms having atomic numbers which, on average, are greater than 40. Examples of such materials include gold, amongst others. However, membranes made of heavy elements are desirably sufficiently thin so as to avoid an excessive absorption of the secondary electrons by the membrane. By way of example, a monolayer made of gold can be used as a membrane. By way of example, the thin layer made of gold can be evaporated onto a thicker, more stable carrier layer made of aluminum, for example.

According to exemplary embodiments, the converters are each formed from a material which is provided at inner walls of the openings of the multi-aperture plate. According to exemplary embodiments, this material is different from a material that is the structural material of the multi-aperture plate. For example, the material forming the converter is applied as a layer to the inner walls of the openings of the multi-aperture plate.

According to exemplary embodiments, the material has atoms having atomic numbers which, on average, are greater than 40.

According to exemplary embodiments, the openings of the multi-aperture plate have a conical form such that the cross section of an opening reduces in the direction away from the object plane. According to exemplary embodiments, the openings of the multi-aperture plate have a first cross-sectional area on their side facing the object plane and a second cross-sectional area on their side facing away from the object plane, wherein the first cross-sectional area is at least 1.5 times (e.g., 2.0 times) larger than the second cross-sectional area.

According to exemplary embodiments, the multi-beam particle microscope includes a voltage supply system, which is configured to respectively supply an adjustable electric potential to the object and to the multi-aperture plate.

According to exemplary embodiments, the voltage supply system is configured to have: i) a first mode of operation to supply electric potentials to a side of the multi-aperture plate facing the object and to the object in such a way that the object is at a negative electric potential relative to the multi-aperture plate so that secondary electrons generated at the object pass through the openings in the multi-aperture plate and likewise provide electrons which form the electron beams which are detected by the detector arrangement; and ii) a second mode of operation to supply electric potentials to the side of the multi-aperture plate facing the object and to the object in such a way that the object is at a positive electric potential relative to the multi-aperture plate so that secondary electrons generated at the object do not pass through the openings in the multi-aperture plate. This facilitates selective switching between a mode of operation in which secondary electrons contribute to the electron beams that are detected by the detector arrangement and a mode of operation in which secondary electrons do not contribute to the detected electrons and consequently only the backscattered electrons generated at the object contribute to the detected electrons. In this case, the electron-microscopic image generated by the detected electrons is a so-called pure backscattered electron image.

According to exemplary embodiments, the multi-aperture plate includes three conductive layers that are insulated from one another. The voltage supply system can be configured to respectively supply adjustable electric potentials to the three conductive layers.

By way of example, the first energy threshold can be greater than 50 eV, such as greater than 200 eV. By way of example, the second energy threshold can be less than 200 eV, such as less than 100 eV. By way of example, the number of primary particle beams can be greater than 7, such as greater than 50.

According to exemplary embodiments, the multi-aperture plate is arranged at a distance from the object plane of less than 200 µm (e.g., less than 50 µm, less than 30 µm, less than 20 µm, less than 10 µm).

According to exemplary embodiments, the multi-aperture plate is arranged at a distance from the object plane that is smaller than a smallest spacing of the apertures of the multi-aperture plate from one another.

According to exemplary embodiments, a minimum spacing between two mutually adjacent primary particle beams at the multi-aperture plate is less than 50 µm (e.g., less than 30 µm, less than 20 µm, less than 12 µm).

BRIEF DESCRIPTION OF THE FIGURES

Embodiments of the disclosure are explained in greater detail below with reference to figures, in which.

DETAILED DESCRIPTION

Figure 1:
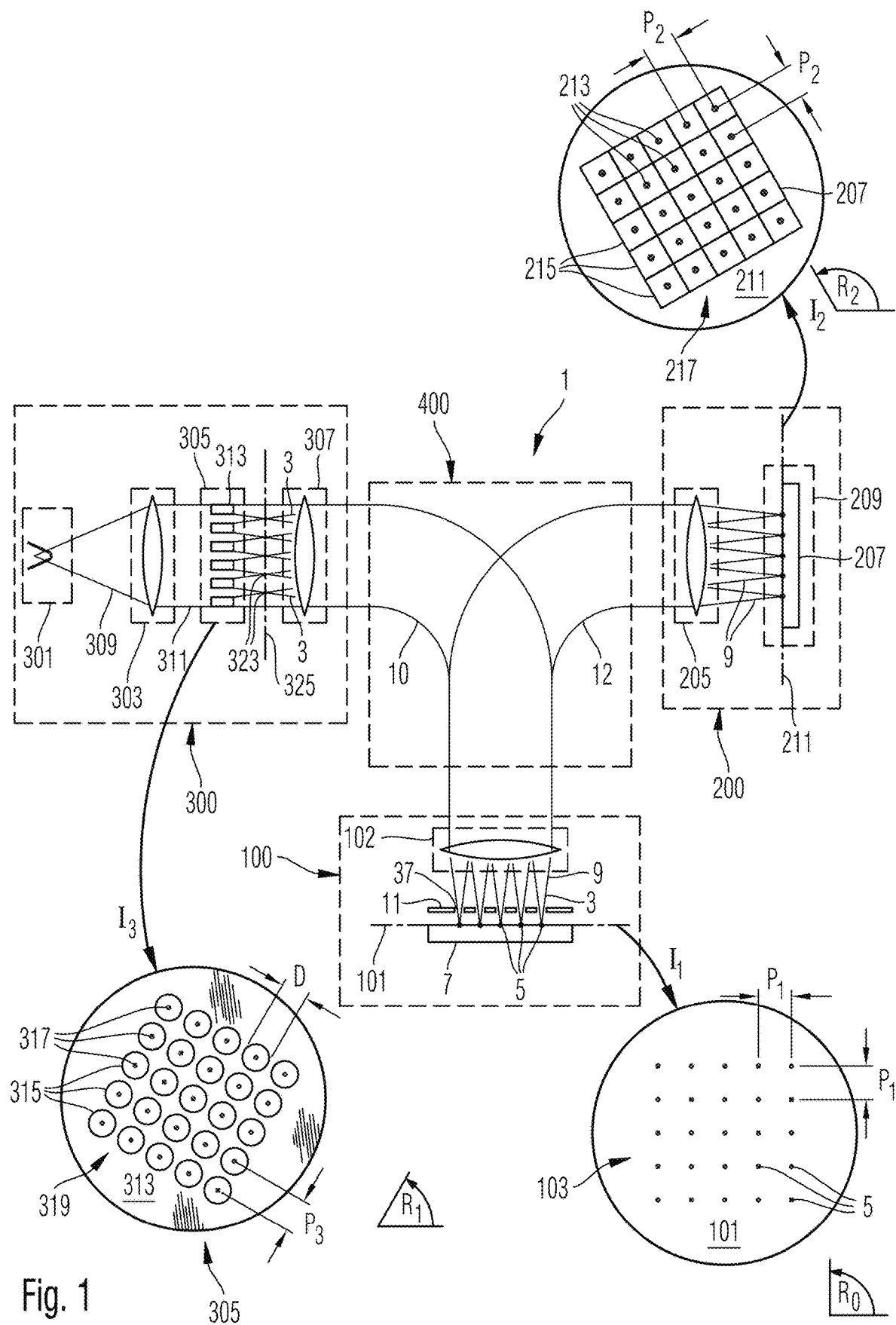
FIG. 1 shows a schematic illustration for explaining a functionality of a multi-beam particle microscope.

FIG. 1 is a schematic illustration of a multi-beam particle microscope which uses a plurality of particle beams. The multi-beam particle microscope generates a plurality of primary particle beams which strike an object to be examined in order to generate there secondary particles which emanate from the object and are shaped into secondary particle beams, which are subsequently detected. The multi-beam particle microscope 1 is of the scanning electron microscope (SEM) type, which uses electron beams 3 as primary particle beams, which are incident at locations 5 on a surface of the object 7 and generate a plurality of electron beam spots or electron spots there. The electrons of the primary particle beam incident on the object at these beam spots generate electrons as secondary particles, which are shaped into secondary particle beams and detected. These electrons generated as secondary particles are frequently divided with respect to their kinetic energy into backscattered electrons and secondary electrons. In general, electrons with amounts of kinetic energy that are less than 50 eV are referred to as secondary electrons and electrons with amounts of kinetic energy that are greater than 50 eV are referred to as backscattered electrons.

However, the primary particle beams could also be ion beams. These can likewise generate electrons as secondary particles when incident on the object, which secondary particles are shaped into secondary particle beams and detected. Here, too, electrons with amounts of kinetic energy that are less than 50 eV can be referred to as secondary electrons and electrons with amounts of kinetic energy that are greater than 50 eV can be referred to as backscattered electrons.

The object 7 to be examined can be of any desired type and include for example a semiconductor wafer, a biological sample, and an arrangement of miniaturized elements or the like. The surface of the object 7 is arranged in an object plane 101 of an objective lens 102 of an objective lens system 100.

The enlarged excerpt I1 in FIG. 1 shows a plan view of the object plane 101 having a regular rectangular field 103 of impingement locations 5 of primary particle beams 3 formed in the plane 101. In FIG. 1, the number of impingement locations is 25, which are arranged as a 5×5 field 103. The number 25 of impingement locations is a small number chosen for reasons of simplified illustration. In practice, the number of beams or impingement locations can be chosen to be significantly greater, such as, for example, 20×30, 100× 100 and the like.

In the embodiment illustrated, the field 103 of impingement locations 5 is a substantially regular rectangular field having a constant spacing p1 between adjacent impingement locations. Exemplary values of the spacing p1 are 50 µm, 30 µm or 10 µm. However, it is also possible for the field 103 to have other symmetries, such as a hexagonal symmetry, for example.

A diameter of the beam spots shaped in the object plane 101 can be small. Exemplary values of this diameter are 1 nm, 5 nm, 10 nm and 30 nm. The focusing of the particle beams 3 for shaping the beam spots 5 is carried out by the objective lens system 100.

The particles striking the object, which are electrons in the example explained here, generate particles in turn, which are substantially electrons and which emanate from the surface of the object 7. The electrons emanating from the surface of the object 7 are shaped by the objective lens system 100 to form electron beams 9. The multi-beam particle microscope 1 provides a secondary beam path 12 for supplying the multiplicity of electron beams 9 to a detection system 200. The detection system 200 includes an electron optical unit having a projective lens system 205 to direct the electron beams 9 onto an electron multi-detector 209.

The excerpt I2 in FIG. 1 shows a plan view of a plane 211, in which are arranged individual detection regions on which the electron beams 9 are incident at locations 213. The impingement locations 213 form a second field 217 with a regular spacing p2 of the impingement locations from one another. Exemplary values of the spacing p2 are 10 µm, 100 µm, 200 µm and 500 µm.

The primary particle beams 3 are generated by a multi-beam particle source 300 including at least one electron source 301 with an electron emitter, at least one collimation lens 303, a multi-aperture arrangement 305 and a field lens system 307. The electron source 301 generates a diverging electron beam 309 from electrons emitted by the electron emitter, which diverging electron beam is collimated by the collimation lens 303 to form a beam 311 which illuminates the multi-aperture arrangement 305.

The excerpt I3 in FIG. 1 shows a plan view of the multi-aperture arrangement 305. The multi-aperture arrangement 305 includes a multi-aperture plate 313, which has a plurality of openings or apertures 315 formed therein. Midpoints 317 of the openings 315 are arranged in a field 319 corresponding to the field 103 formed by the beam spots 5 in the object plane 101. A spacing p3 of the midpoints 317 of the apertures 315 from one another can have exemplary values of 5 µm, 100 µm and 200 µm. The diameters D of the apertures 315 are smaller than the spacing p3 of the midpoints of the apertures from one another. Exemplary values of the diameters D are 0.2×p3, 0.4×p3 and 0.8×p3.

Electrons of the illuminating beam 311 pass through the apertures 315 and form electron beams 3 as primary particle beams. Electrons of the illuminating beam 311 which strike the plate 313 are absorbed by the latter and do not contribute to the formation of the electron beams 3.

The multi-aperture arrangement 305 focuses the electron beams 3 in such a way that beam foci 323 are formed in a plane 325. A diameter of the foci 323 can be, for example, 2 nm, 10 nm, 100 nm and 1 µm.

The field lens system 307, a beam splitter 400 and the objective lens 102 provide a first imaging particle optical unit and form a primary beam path 10 for imaging the plane 325 in which the foci 323 are formed onto the object plane 101 such that a field 103 of impingement locations 5 or beam spots is formed there on the surface of the object 7.

The objective lens 102, the beam splitter 400 and the projective lens system 205 provide a second imaging particle optical unit and form a secondary beam path 12 for imaging the object plane 101 onto the detection plane 211. The objective lens 102 is consequently a lens that is both part of the primary beam path 10 and of the secondary beam path 12, while the field lens system 307 is only part of the primary beam path 10 and the projective lens system 205 is only part of the secondary beam path 12. Consequently, the beam paths of the primary particle beams 3 and the beam paths of the (secondary) electron beams pass through the objective lens 102.

The beam splitter 400 is arranged in the primary beam path 10 between the multi-aperture arrangement 305 and the objective lens system 100. The beam splitter 400 is also part of the secondary beam path 12 and arranged therein between the objective lens system 100 and the detection system 200. The beam splitter 400 separates the beam paths of the primary particle beams 10 from the beam paths of the (secondary) electron beams.

Further information concerning such multi-beam particle microscopes and components used therein, such as, for instance, particle sources, multi-aperture plates and lenses, can be obtained from the international applications WO 2005/024881 A2, WO 2007/028595 A2, WO 2007/028596 A1 and WO 2007/060017 A2, and the patent applications US 2015/0083911 A1, US 2015/0069235 A1, DE 10 2014 008 383 A1, U.S. Pat. No. 6,946,655 B2 and DE 10 2016 120 902 A1, the disclosure of which in the full scope thereof is respectively incorporated by reference in the present application.

The multi-beam particle microscope 1 further includes a multi-aperture plate 11 with a multiplicity of openings 37 which is arranged between the objective lens 102 and the object plane 101. In the embodiment explained in FIG. 1, 25 openings are provided in the multi-aperture plate 11 in such a way that, during the operation of the multi-beam particle microscope 1, each of the openings 37 is penetrated by a primary particle beam 3 and each of the openings can be penetrated by a (secondary) electron beam 9.

Figure 2:
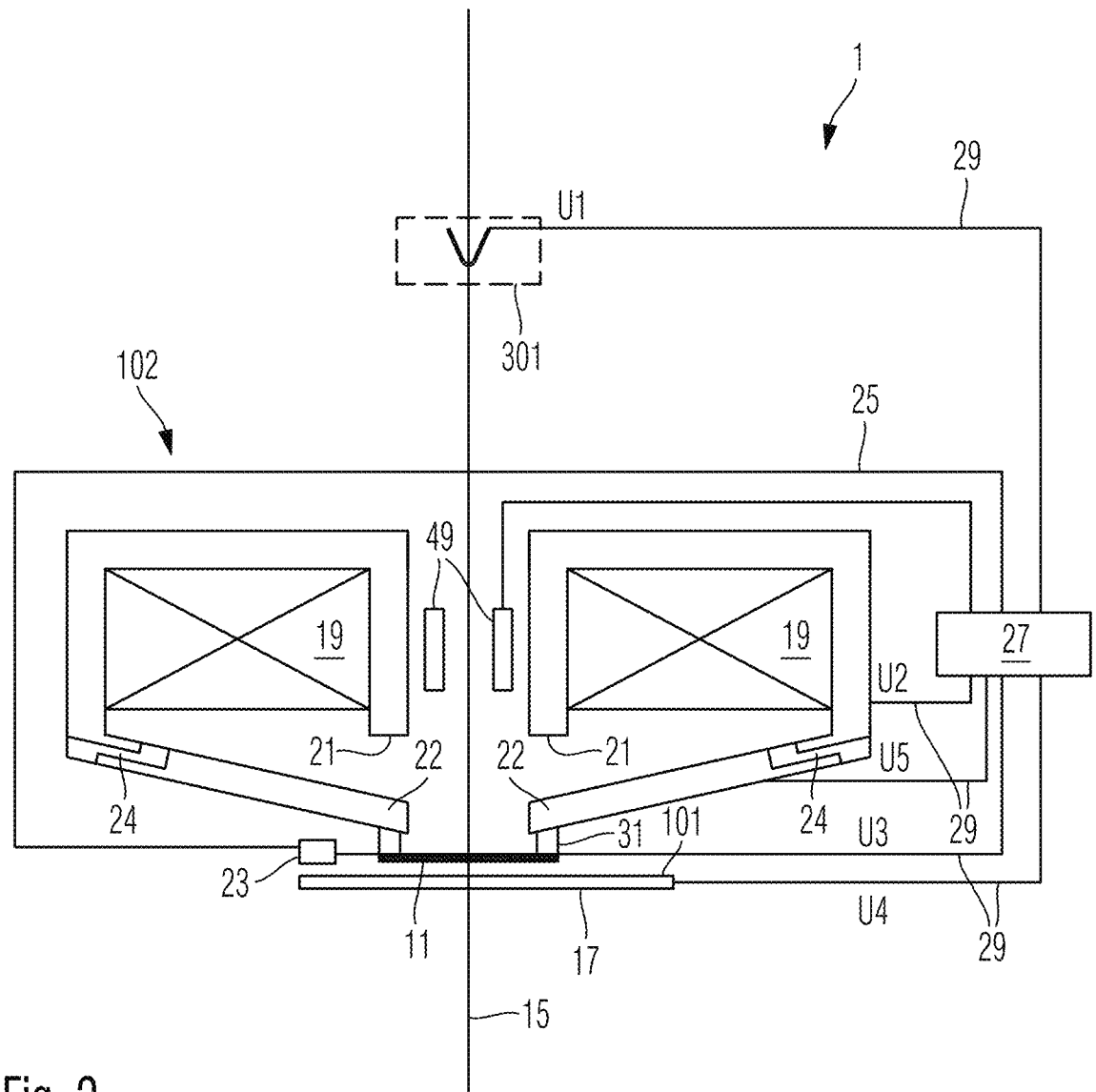
FIG. 2 shows a schematic illustration of part of the multi-beam particle microscope of FIG. 1.

In a simplified schematic illustration, FIG. 2 shows the objective lens 102, which includes a coil body 19, an upper pole shoe 21 and a lower pole shoe 22 such that a gap is formed therebetween, where a magnetic field that focuses the primary particle beams is generated. The multi-aperture plate 11 is held on, and fastened to, the lower pole shoe 22 of the objective lens 102 by way of an electrically insulating holder 31. As an alternative to fastening the multi-aperture plate 11 to the objective lens 102, an actuator 23 could be provided, the latter being able to selectively remove the aperture plate from or arrange the aperture plate in the region between the objective lens 102 and the object plane 101, the multi-aperture plate 11 being pressed against the holder 31, which acts as a spacer, by way of a suitable mechanism when arranged between the objective lens 102 and the object plane 101. The actuator 23 is controlled by a controller 27 of the multi-beam particle microscope 1 by way of a control line 25.

The controller 27 further includes a voltage supply system for applying a first electric potential U1 to the particle emitter of the particle source 301, for applying a second electric potential U2 to the upper pole shoe 21 of the objective lens 102, for applying a third electric potential U3 to the multi-aperture plate 11, for applying a fourth electric potential U4 to the object holder 17 with the object 7 arranged thereon and for applying a fifth electric potential U5 to the lower pole shoe 22 of the objective lens 102. For the purposes of supplying the electric potentials U1, U2, U3, U4 and U5 to the particle emitter of the particle source 301, the upper pole shoe 21, the multi-aperture plate 11, the object holder 17 and the lower pole shoe 22, potential supply lines 29 are provided between these components and the controller 27.

A magnetic circuit extending in the objective lens between the end of the upper pole shoe 21 and the end of the lower pole shoe 22 is separated by an electrical insulator 24, which allows the application of different electric potentials U2 and U5, respectively, to the upper and the lower pole shoe. Here, the insulator 24 is designed such that the two parts of the magnetic circuit adjoining the insulator 24 overlap geometrically in order to achieve a low resistance for the magnetic flux.

The difference between the potentials U1 and U4 determines the kinetic energy with which the particles of the primary particle beams 3 strike the object. By way of example, this difference can assume values between 50 V and 3 kV.

An electrode (anode) can be arranged in the beam path of the primary particle beams 3, either in the particle source 301 or following the latter, in order to accelerate the particles to a high kinetic energy such that these quickly traverse the path to the objective lens 102 and through the latter. The second electric potential U2 can likewise be applied to this electrode. The difference between U1 and U2 then determines the kinetic energy of the particles between the multi-beam particle source and the objective lens 102 and, by way of example, can be greater than 5 kV, greater than 15 kV or greater than 25 kV. There is an electric field between the upper pole shoe 21, to which the second electric potential U2 has been applied, and the lower pole shoe 22, to which the fifth electric potential U5 has been applied, the electric field retarding the primary particles on their path to the object 7 and accelerating the electron beams 9 on their path to the detector. Further, the third electric potential U3 has been applied to the multi-aperture plate 11.

Figure 3:
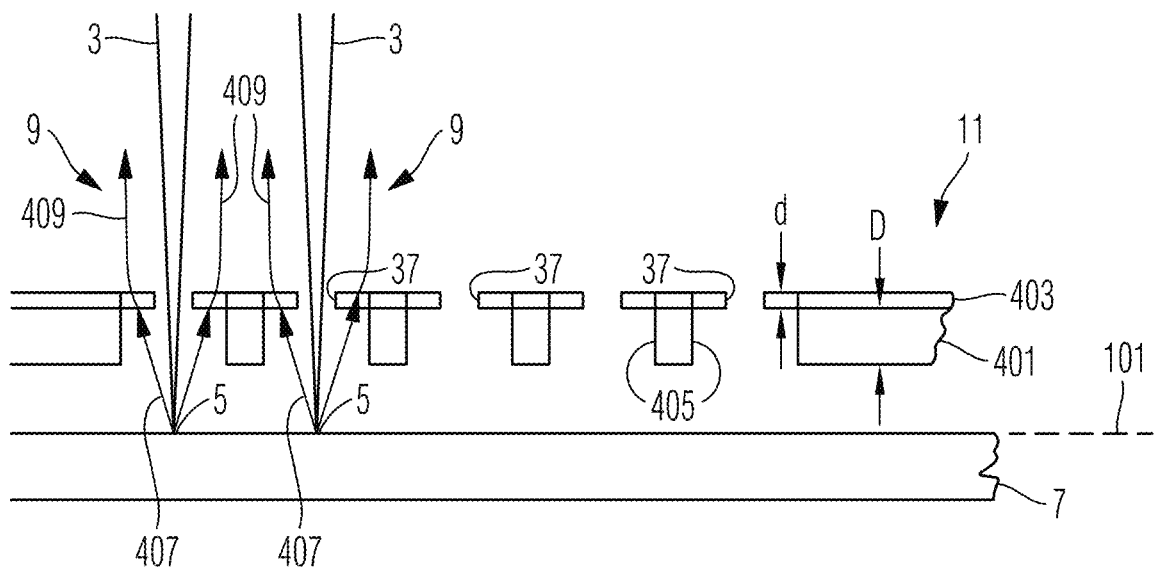
FIG. 3 shows a schematic sectional illustration of a multi-aperture plate with converters of the multi-beam particle microscope of FIG. 1.

FIG. 3 shows a magnified illustration of the multi-aperture plate 11 in cross section. The multi-aperture plate 11 includes a carrying substrate 401, on which a converter layer 403 has been applied. The openings 37, through which the primary particle beams 3 pass on their path to the object 7, are provided in the converter layer. By way of example, the openings 37 can be circular openings and have a diameter of, e.g., 1 μm, 2 μm or 5 μm.

The substrate 401 has through holes 405 with a diameter that is substantially larger than the diameter of the cutouts 37 in the converter layer 403, the through holes being arranged in relation to the cutouts 37 in the converter layer 403 in such a way that the openings 405 in the substrate 401 are partly covered by the converter layer. Consequently, the converter layer 403 defines and delimits the openings 37 through which the primary particle beams 3 pass. Further, there are regions of the converter layer 403 along the perimeter of the openings 37, at which the converter layer 403 is not supported by the substrate 401.

Here, the diameter of the cutouts 37 in the converter layer 403 is matched to the beam diameter of the primary particle beams 3 in such a way that, before the primary particles are incident on the object 7, the primary particles do not cause any noteworthy background noise of secondary electrons generated directly at the converter layer. By way of example, the beam diameter of the primary particle beams 3 is no more than 70%, in particular no more than 50% and in particular no more than 20% of the diameter of the cutouts 37 in the converter layer 403. The tilt point of the beam deflection system for scanning the object 7 with the primary particle beam bundles 3 should be located so close to the plane of the converter layer 403 that a migration of the primary particle beam bundle 3 in the plane of the converter layer 403 remains sufficiently small, even when scanning the object, so that the primary particles, before striking the object 7, do not cause any noteworthy background noise of secondary electrons generated thereby directly at the converter layer.

The particles of the primary particle beam 3 striking the object 7 generate electrons at the impingement location 5 on the surface of the object 7 by interaction of the particles with the material of the object 7, which electrons emerge from the surface of the object 7. Usually, these electrons generated by the primary particles are subdivided into two categories, specifically secondary electrons on the one hand and backscattered electrons on the other hand. The backscattered electrons have amounts of kinetic energy upon their emergence from the surface of the object 7 which correspond to the kinetic energy of the incident primary particles, or which are slightly lower than these. The secondary electrons have amounts of energy that are substantially lower than the kinetic energy of the incident primary particles.

Both the backscattered electrons and the secondary electrons emerge from the surface of the object 7 over a broad solid angle range. In a conventional multi-beam particle microscope, there is an electric field between the objective lens and the object, the electric field, firstly, retarding the particles of the primary particle beams on their path to the object and, secondly, accelerating the electrons emerging from the object away from the object. Since the secondary electrons emerging from the object have relatively low amounts of kinetic energy when they emerge from the object, the kinetic energy, speed and movement direction thereof are substantially determined by the electric field that accelerates the electrons away from the object. In particular, the velocity components of the secondary electrons emerging from the object are small in the direction parallel to the surface of the object, and so the secondary electrons move away from the object 7 substantially perpendicular to the object plane 101 following an acceleration by the electric field provided between the object and the objective lens. In the case of a sufficient spacing of the locations 5 from one another, trajectories of secondary electrons emerging from the object 7 at mutually adjacent locations 5 hardly overlap as a result thereof. This allows electron beams 9 to be formed from the secondary electrons emerging from the object 7, which electron beams can be guided in the secondary beam path 12 to the detector arrangement 211 as separate beams.

Since the backscattered electrons have a relatively high kinetic energy when they emerge from the object 7, the kinetic energy, movement speed and movement direction thereof following acceleration in the electric field provided between the objective lens and the object 7 is not predominantly determined by the field; instead, it is likewise significantly determined by their movement direction when they emerge from the surface of the object. If the components oriented parallel to the object plane 101 of the velocities of the backscattered electrons emerging from the object are sufficiently large in the case of a given spacing between mutually adjacent impingement locations 5 of the primary beams 3 on the object 7, it is possible for there to be an overlap between trajectories of backscattered electrons emerging from the object 7 at mutually adjacent locations 5. Then, such backscattered electrons, which emanate from different impingement locations 5, cannot be guided through the secondary beam path 12 to the detector arrangement as separate beams. In the case of backscattered electrons, this situation arises for a relatively large portion of the emerging backscattered electrons on account of their relatively high kinetic energy upon emergence from the object, and so the efficiency with which backscattered electrons are detected in a manner assignable to the individual impingement locations 5 is very low. This leads to contrasts between different materials in the object, which can easily be made visible using the single-beam particle microscope when detecting the backscattered electrons, being hardly detectable in the conventional multi-beam particle microscope.

The converter layer 403 provided at the multi-aperture plate 11 is configured to convert backscattered electrons into secondary electrons 409. To this end, backscattered electrons 407, which emerge from the object 7 at a location 5 in the plane 101, strike the side of the converter layer 403 facing the object 7, to be precise in the regions where the converter layer 403 is not supported by the substrate 401. In the converter layer 403, the backscattered electrons 407 generate secondary electrons, at least a portion 409 of which emerge from the converter layer 403 from the side thereof facing away from the object 7. When they emerge from the converter layer 403, these converted secondary electrons 409 have a kinetic energy that is substantially lower than the kinetic energy of the backscattered electrons 407 when the latter emerge from the object 7. In particular, these secondary electrons 409 have small velocity components parallel to the object plane 101 and are accelerated away from the object 7 in the electric field provided between the objective lens 102 and the object 7 and can be supplied by the secondary optical unit 12 to the detector arrangement 209 without there being an overlap in the trajectories of secondary electrons 409 generated from backscattered electrons 407 emanating from different locations 5 on the surface of the object 7. Consequently, these secondary electrons 409 can form electron beams which are supplied to the detector arrangement as separate beams by the secondary optical unit 12. In particular, these secondary electrons 409 can form electron beams together with the secondary electrons which emerge from the object 7 directly at the impingement locations 5 and which pass through the openings 37, the intensities of the electron beams being detectable by the detector arrangement. Consequently, the converter layer 403 allows the generation of measurement signals which are assignable to a certain impingement location 5 of a primary electron beam 3 on the object 7 and which represent the intensity of the backscattered electrons 407 generated at this location 5.

Here it is possible to operate the multi-beam particle microscope 1 in two different modes of operation. In a first of the two modes of operation, the potential U3, which is supplied to the multi-aperture plate 11, is greater than the potential U4, which is supplied to the object 7. As a result of this, the secondary electrons emerging from the surface of the object 7 are accelerated towards the multi-aperture plate 11 and partly pass through the openings 37 in the converter layer 403 such that these secondary electrons contribute to the electron beams formed from the secondary electrons 409 which are formed from the converter layer 403 following the conversion from backscattered electrons 407. Consequently, both secondary electrons and backscattered electrons, which emerge from the object 7, are detected in the first mode of operation.

In a second of the two modes of operation, the electric potential U3 supplied to the multi-aperture plate 11 is less than the electric potential U4 supplied to the object 7. As a result, the low kinetic energy secondary electrons emerging from the object do not reach the multi-aperture plate 11 and, in particular, are unable to pass through the openings 37 in the converter layer 403.

Therefore, the secondary electrons emerging from the object do not generate any detection signals generated by the detector arrangement. Only backscattered electrons are detected in the second mode of operation.

The converter layer 403 preferably includes a material with a high atomic number. Gold is an example of a suitable material. A thickness d of the converter layer is dimensioned such that backscattered electrons 407, which strike the side of the converter layer 403 facing the object 7, lead to a great number of secondary electrons 409 which emerge from the converter layer 403 on the side thereof facing away from the object 7. The optimal thickness determined thus depends on the kinetic energy of the backscattered electrons 407 and is therefore dependent in turn on the kinetic energy with which the primary particles are incident on the object. However, the thickness d of the converter layer 403 need not correspond to this optimal thickness and it is possible to use a converter layer 403 of a given thickness d for a broad range of amounts of kinetic energy of the primary particles when incident on the object. The thickness of the converter layer can be located, for example, in a range from one atomic layer to 40 nm or from 0.5 nm to 20 nm.

The substrate 401 is formed from a material that can satisfy the function of serving as a carrying structure for the converter layer 403. By way of example, the substrate 401 can be formed from a single silicon crystal. To this end, a plate made of a single silicon crystal, which forms the substrate 401 of the multi-aperture plate 11, can be coated by a material that forms the converter layer 403 of the multi-aperture plate 11, and the openings 405 in the silicon plate and the openings 37 in the converter layer 403 can be introduced into the silicon plate and into the converter layer by lithographic methods in order to manufacture the multi-aperture plate 11.

Figure 4:
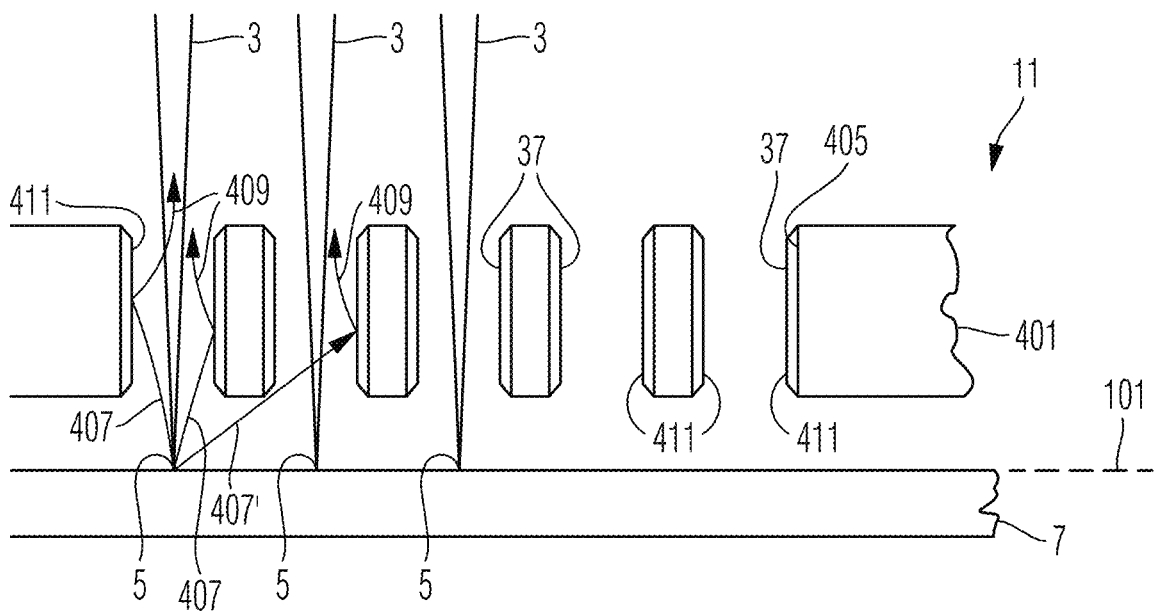
FIG. 4 shows a schematic sectional illustration of a multi-aperture plate with converters of the multi-beam particle microscope of FIG. 1.

FIG. 4 shows an illustration, corresponding to FIG. 3, of a multi-aperture plate 11, which is configured to convert backscattered electrons into secondary electrons, which form electron beams that are supplied to the detector arrangement 209 as separate beams by way of the secondary optical unit 12.

In the example of a multi-aperture plate shown in FIG. 4, the converter material is not applied to a flat side of a substrate 401 of the multi-aperture plate 11 as a layer 403, as is the case in the example of FIG. 3; instead, it is applied as a layer to inner walls of openings 405 in the substrate 401. Consequently, the surfaces of the layers 411 made of converter material form the openings 37 in the multi-aperture plate 11 through which the primary beams 3 pass. Backscattered electrons 407 emerging from the object 7 strike the converter layer 411 within the apertures 37 and are converted into secondary electrons 409 which enter the opening 37 from the layer 411. These secondary electrons 409 emerging from the converter layer are accelerated away from the object 7 by the electric field provided between the objective lens and the object 7 and form beams which are supplied to the detector arrangement 211 by way of the secondary optical unit 12. Consequently electrons 407 emerging from the object 7 can also be converted into secondary electrons, which are detectable by the detector arrangement 209, using a multi-aperture plate 11 according to the embodiment shown in FIG. 4. The multi-aperture plate of the embodiment shown in FIG. 4 is also operable in the two modes of operation that were explained above in conjunction with FIG. 3. These two modes of operation render it possible to detect both backscattered electrons on their own and backscattered electrons and secondary electrons, both of which emerge from the object 7.

In FIG. 4, reference sign 407' denotes a backscattered electron which emanates from the surface of the object 7 at a location 5 with a large velocity component parallel to the object plane 101. This backscattered electron 407' is able to strike the converter layer 411 at the inner wall of the cutout 37 which is assigned to the impingement location 5 of the primary beam 3 that differs from the location from which the backscattered electron 407 emanates. Consequently, the backscattered electron 407 generates secondary electrons 409 in the "wrong" cutout 37 and the detection events resulting therefrom are consequently assigned to the wrong primary particle beam 3. This effect can be referred to as crosstalk between various particle beams.

Figure 5:
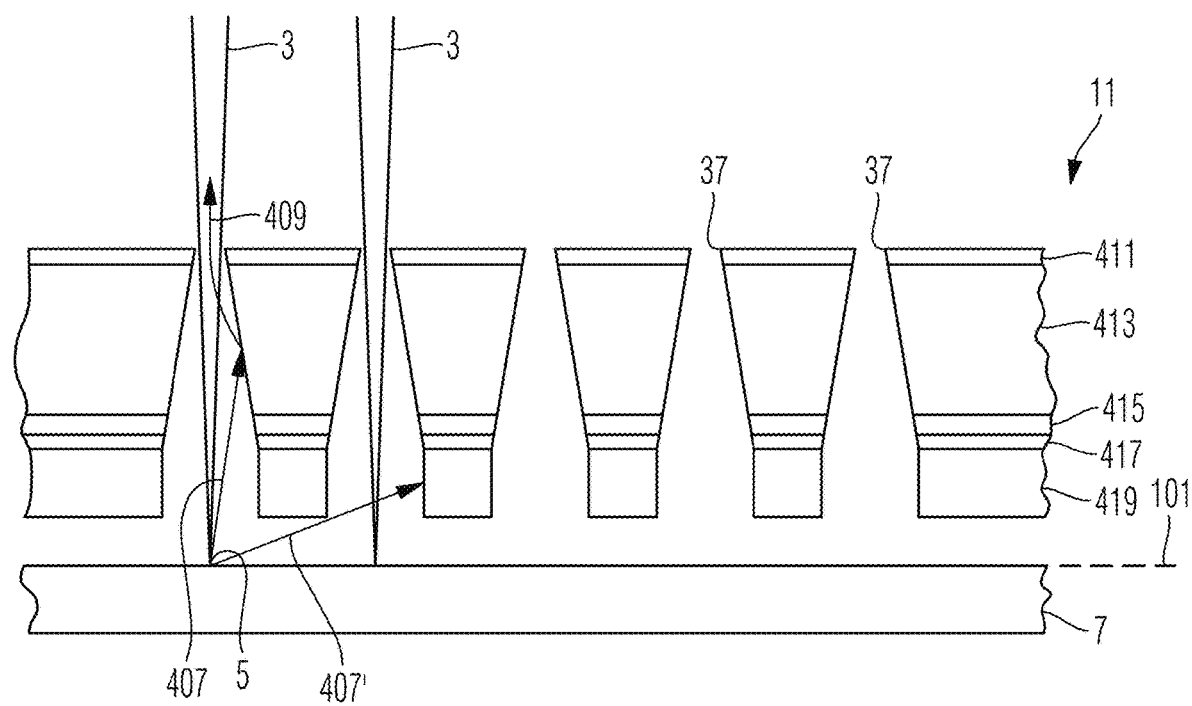
FIG. 5 shows a schematic sectional illustration of a multi-aperture plate with converters of the multi-beam particle microscope of FIG. 1.

FIG. 5 shows a cross section of a multi-aperture plate 11 according to a further embodiment, in which this crosstalk effect is reduced.

The multi-aperture plate 11 shown in cross section in FIG. 5 has a multi-layer structure, in which the apertures 37 are provided. The following layers are provided from top to bottom in the illustration of FIG. 5, i.e., in the direction towards the object plane 101: an electrically conductive layer 411, a converter layer 413, which is electrically insulating, an electrically conductive layer 415, an electrically insulating layer 417 and an absorber layer 419, which is electrically conductive.

Here, it may be advantageous if a predetermined electric potential is applied to the electrically conductive layers 411, 415 or 419, the electric potential being determined in such a way that the primary beams 3 are not substantially influenced by electric fields arising between the electrically conductive layers 411, 415 and 419. Further, the electrically insulating converter layer 413 could have a sufficiently large remaining resistance such that a current can flow through the layer, the current defining the potentials of the electrically conductive layers 411, 415 and 419 during operation.

The converter layer 413 is either formed entirely of a material that converts backscattered electrons 407 into secondary electrons 409, which material is exposed at the inner walls of the cutout 37, or it is formed from a purely electrically insulating material, in which layers made of a converter material are provided at the inner walls of the cutouts 37, as explained above in conjunction with the embodiment shown in FIG. 4.

The absorber layer 419 is made of a material which generates very few secondary electrons per incident backscattered electron and, in particular, generates substantially fewer secondary electrons than the converter material.

Here, it may be advantageous to design the layers such that, during operation, the absorber layer 419 has an electric potential that is higher than that of the converter layer 413 by, e.g., 10 V, 20 V or 50 V in order to prevent secondary electrons generated at the absorber from reaching the converter and, from there, the detector.

Reference sign 407 in FIG. 5 denotes a backscattered electron which emerges from a location 5 on the surface of the object 7 and which strikes the inner wall of the aperture 37 assigned to the location 5 from which the backscattered electron 407 emanates. In the converter layer 413 on the inner wall of the cutout 37, the backscattered electron 407 is converted into one or more secondary electrons 409, some of which emerge from the opening 37 on the side of the multi-aperture plate facing away from the object 7 and, as described above, can be detected by the detector arrangement in such a way that they can be assigned to the correct primary particle beam 3.

Reference sign 407' in FIG. 5 shows a backscattered electron 407 which strikes the inner wall of the adjacent opening 37 and hence the inner wall of the "wrong" opening and which can therefore potentially generate crosstalk between various detected electron beams. However, the geometry of the openings 37, the thickness of the absorber layer 419 and the distance between the surface of the multi-aperture plate 11 facing the object 7 or the absorber layer 419 and the surface of the object 7 are chosen in such a way that the backscattered electrons 407' emanating from the location 5 which strike the adjacent, "wrong" opening 37 merely strike inner surfaces of the opening 37 there located in the region of the absorber layer 419. However, at the location, these incident backscattered electrons 407' are not converted into secondary electrons, or only converted into secondary electrons, which are ultimately detected, to a very small extent.

In the exemplary embodiment of FIG. 5, the voltage supply system is configured to apply different and respectively adjustable electric potentials to the conductive layers 411, 415 and 419. In particular, this renders the following modes of operation possible:

A higher or lower electric potential relative to the object 7 can be applied to the layer 419 arranged closest to the object 7 in order to realize the two modes of operation described above in conjunction with FIG. 3, in which backscattered electrons and secondary electrons emanating from the object are detected together or in which only backscattered electrons are detected.

A potential difference can be applied between the conductive layers 411 and 415; this generates an electric field in the region of the converter layer 413 within the cutouts 37, the electric field accelerating the secondary electrons generated on the walls of the cutout 37 upwards in FIG. 5 and hence away from the object 7. This increases the probability of a secondary electron generated on the wall of the cutout 37 also emerging from the opening 37 at the upper side of the multi-aperture plate 11 and not, for instance, being absorbed within the opening.

Further, as illustrated in FIG. 5, the openings 37 can have a conical form such that the cross-sectional area of the cutouts 37 increases in the direction towards the object 7. Together with the provision of the absorber layer 419, this consequently renders it possible to increase the solid angle at which the backscattered electrons 407 can emanate from the location 5 at the surface of the object 7 and are converted into secondary electrons 409 at the inner wall of the associated cutout 37 without increasing the probability of crosstalk.

In this exemplary embodiment, the diameter of the cutouts 37 is matched to the beam diameter of the primary particle beams 3 in such a way that, before the primary particles are incident on the object 7, the primary particles do not cause any noteworthy background noise of secondary electrons generated thereby directly at the converter layer 413. By way of example, the beam diameter of the primary particle beams 3 is no more than 70%, in particular no more than 50% and in particular no more than 20% of the diameter of the cutouts in the layers 411 or 413. The tilt point of the beam deflection system for scanning the object 7 with the primary particle beam bundles 3 should be located so close to the plane of the substrate 401 of the multi-aperture plate that a migration of the primary particle beams 3 within the cutouts 37 remains sufficiently small, even when scanning the object, so that the primary particles, before striking the object 7, do not cause any noteworthy background noise of secondary electrons generated thereby directly at the converter layer 413.

What is claimed is:

1. A multi-beam particle microscope, comprising:
   a multi-beam particle source configured to generate a multiplicity of primary particle beams;
   an objective lens configured so that, during use of the multi-beam particle microscope, the objective lens: i) is penetrated by beam paths of the multiplicity of primary particle beams; ii) directs each of the multiplicity of primary particle beams onto an object plane; and iii) focuses each of the multiplicity of primary particle beams on the object plane;
   a detector arrangement; and
   a multi-aperture plate comprising a multiplicity of openings and a multiplicity of converters,
   wherein:
   the multi-aperture plate is between the objective lens and the object plane;
   the multiplicity of openings is configured so that, during use of the multi-beam particle microscope, different openings of the multi-aperture plate are penetrated by beam paths of different primary particle beams;
   for each opening of the multiplicity of openings, at least one converter is disposed at the opening;
   the multi-beam particle microscope is configured so that, during use of the multi-beam particle microscope: i) the primary particle beams generate backscattered electrons at the object; ii) the backscattered electrons have amounts of kinetic energy at the object that are greater than a first energy threshold; iii) the converters convert the backscattered electrons into converted electrons; iv) the converted electrons have amounts of kinetic energy at the converter that are less than a second energy threshold; and v) the converted electrons form electron beams having intensities that are detected by the detector arrangement.

2. The multi-beam particle microscope of claim 1, wherein each converter comprises a membrane substantially parallel to the object plane.

3. The multi-beam particle microscope of claim 2, wherein the multi-beam particle microscope is configured so that, during use of the multi-beam particle microscope: i) the backscattered electrons strike the surface of the membranes; and ii) the converted electrons emerge from the surface of the membranes.

4. The multi-beam particle microscope of claim 2, wherein each membrane has a thickness of from 0.5 nm to 50 nm.

5. The multi-beam particle microscope of claim 2, wherein each membrane comprises a material comprising atoms having atomic numbers which, on average, are greater than 40.

6. The multi-beam particle microscope of claim 1, wherein each converter comprises a material that coats inner walls of the openings of the multi-aperture plate.

7. The multi-beam particle microscope of claim 6, wherein the material comprises atoms having atomic numbers which, on average, are greater than 40.

8. The multi-beam particle microscope of claim 1, wherein:
   the openings of the multi-aperture plate have a first cross-sectional area on a side facing the object plane;
   the openings of the multi-aperture plate has a second cross-sectional area on a side facing away from the object plane; and
   the first cross-sectional area is at least 1.5 times larger than the second cross-sectional area.

9. The multi-beam particle microscope of claim 1, further comprising a voltage supply system configured to supply: i) an adjustable electric potential to the object; and ii) an adjustable electric potential to the multi-aperture plate.

10. The multi-beam particle microscope of claim 9, wherein the voltage supply system is configured so that during use of the multi-beam particle microscope:
   in a first mode of operation, the voltage supply supplies electric potentials to a side of the multi-aperture plate facing the object and to the object so that the object is at a negative electric potential relative to the multi-aperture plate so that secondary electrons generated at the object pass through the openings in the multi-aperture plate and provide electrons which form the electron beams which are detected by the detector arrangement; and in a second mode of operation, the voltage supply supplies electric potentials to the side of the multi-aperture plate facing the object and to the object so that the object is at a positive electric potential relative to the multi-aperture plate so that secondary electrons generated at the object do not pass through the openings in the multi-aperture plate.

11. The multi-beam particle microscope of claim 9, wherein the multi-aperture plate comprises three conductive layers that are insulated from one another, and the voltage supply system is configured so that, during use of the multi-beam particle microscope, the voltage supply system supplies adjustable electric potentials to each of the three conductive layers.

12. The multi-beam particle microscope of claim 1, further comprising a multiplicity of absorbers which: i) as seen in the direction of the object plane, are arranged between mutually adjacent openings in the multi-aperture plate; and ii) as seen perpendicular to the object plane, are arranged between the object plane and the converters.

13. The multi-beam particle microscope of claim 12, wherein the absorbers comprise a material comprising having atomic numbers which, on average, are less than 40.

14. The multi-beam particle microscope of claim 12, wherein the multi-beam particle microscope is configured so that, during use of the multi-beam particle microscope, the absorbers are positively charged relative to the converters.

15. The multi-beam particle microscope of claim 14, wherein, during use of the multi-beam particle microscope, a potential difference between the absorbers and the converters is more than 10 V.

16. The multi-beam particle microscope of claim 1, wherein the first energy threshold is greater than 50 eV.

17. The multi-beam particle microscope of claim 1, wherein the second energy threshold is less than 200 eV.

18. The multi-beam particle microscope of claim 1, wherein the multiplicity of primary particle beams comprises more than seven primary particle beams.

19. The multi-beam particle microscope of claim 1, wherein the multi-aperture plate is a distance from the object plane that is less than 200 μm.

20. The multi-beam particle microscope of claim 1, wherein a minimum spacing of two mutually adjacent primary particle beams at the multi-aperture plate is less than 50 μm.

21. A multi-beam particle microscope, comprising:
a multi-beam particle source configured to generate a multiplicity of primary particle beams;
an objective lens which is configured to be penetrated by beam paths of the multiplicity of primary particle beams and configured to direct each of the multiplicity of primary particle beams onto, and focus each of the multiplicity of primary particle beams on, an object plane;
a detector arrangement which is configured to detect intensities of a multiplicity of electron beams, electrons of the electron beams being generated by particles of the primary particle beams at an object which is in the object plane; and
a multi-aperture plate with a multiplicity of openings between the objective lens and the object plane,
wherein different openings of the multi-aperture plate are penetrated by beam paths of different primary particle beams, and
wherein the multi-aperture plate comprises a multiplicity of converters, at least one converter of the multiplicity of converters being provided at each opening of the multiplicity of openings, the converters being configured to convert backscattered electrons which are generated by the primary particle beams at the object and which have amounts of kinetic energy at the object that are greater than a predetermined first energy threshold into electrons which have amounts of kinetic energy at the converter that are less than a predetermined second energy threshold and which provide electrons that form the electron beams that are detected by the detector arrangement.

22. A multi-beam particle microscope, comprising:
a multi-beam particle source configured to generate a multiplicity of primary particle beams;
an objective lens configured so that, during use of the multi-beam particle microscope, the objective lens: i) is penetrated by beam paths of the multiplicity of primary particle beams; ii) directs each of the multiplicity of primary particle beams onto an object plane; and iii) focuses each of the multiplicity of primary particle beams on the object plane; and
a multi-aperture plate comprising a multiplicity of openings and a multiplicity of converters,
wherein:
the multi-aperture plate is between the objective lens and the object plane;
the multiplicity of openings is configured so that, during use of the multi-beam particle microscope, different openings of the multi-aperture plate are penetrated by beam paths of different primary particle beams;
for each opening of the multiplicity of openings, at least one converter is disposed at the opening;
the multi-beam particle microscope is configured so that, during use of the multi-beam particle microscope: i) the primary particle beams generate backscattered electrons at the object; ii) the backscattered electrons have amounts of kinetic energy at the object that are greater than a first energy threshold; iii) the converters convert the backscattered electrons into converted electrons; iv) the converted electrons have amounts of kinetic energy at the converter that are less than a second energy threshold; and v) the converted electrons form electron beams having intensities that are detectable by a detector arrangement.

* * * * *